United States Patent
Yuan et al.

(10) Patent No.: US 8,309,377 B2
(45) Date of Patent: Nov. 13, 2012

(54) FABRICATION OF REFLECTIVE LAYER ON SEMICONDUCTOR LIGHT EMITTING DEVICES

(75) Inventors: Shu Yuan, Singapore (SG); Xuejun Kang, Singapore (SG)

(73) Assignee: Tinggi Technologies Private Limited, Singapore (SG)

( * ) Notice: Subject to any disclaimer, the term of this patent is extended or adjusted under 35 U.S.C. 154(b) by 868 days.

(21) Appl. No.: 11/578,281

(22) PCT Filed: Mar. 1, 2005

(86) PCT No.: PCT/SG2005/000062
§ 371 (c)(1),
(2), (4) Date: Aug. 22, 2007

(87) PCT Pub. No.: WO2005/098974
PCT Pub. Date: Oct. 20, 2005

(65) Prior Publication Data
US 2008/0121908 A1    May 29, 2008

(30) Foreign Application Priority Data
Apr. 7, 2004   (SG) ............................ 200401964-2

(51) Int. Cl.
*H01L 21/00* (2006.01)
(52) U.S. Cl. ............................................... 438/29
(58) Field of Classification Search ............... 438/29
See application file for complete search history.

(56) References Cited

U.S. PATENT DOCUMENTS

| | | | |
|---|---|---|---|
| 3,897,627 A * | 8/1975 | Klatskin | 438/460 |
| 4,107,720 A | 8/1978 | Pucel et al. | |
| 5,192,987 A | 3/1993 | Khan et al. | |
| 5,405,804 A | 4/1995 | Yabe | |
| 5,654,228 A | 8/1997 | Shieh et al. | |
| 5,719,433 A | 2/1998 | Delage et al. | |
| 5,811,927 A | 9/1998 | Anderson et al. | |
| 5,879,862 A * | 3/1999 | Roh | 430/314 |
| 5,917,202 A | 6/1999 | Haitz et al. | |
| 6,020,261 A * | 2/2000 | Weisman | 438/669 |
| 6,091,085 A | 7/2000 | Lester | |
| 6,117,784 A * | 9/2000 | Uzoh | 438/694 |

(Continued)

FOREIGN PATENT DOCUMENTS
CN    1373522    10/2002
(Continued)

OTHER PUBLICATIONS

M.K. Kelly, et al., "Optical Process for Liftoff of Group III-Nitride Films," Physica Status Solidi (a), vol. 159, Issue 1, pp. R3-R4, (Nov. 28, 1996).

(Continued)

*Primary Examiner* — Alexander Ghyka
*Assistant Examiner* — Stanetta Isaac
(74) *Attorney, Agent, or Firm* — Blakely, Sokoloff, Taylor & Zafman LLP

(57) ABSTRACT

Fabrication of Reflective Layer on Semiconductor Light emitting diodes A method for fabrication of a reflective layer on a semiconductor light emitting diode, the semiconductor light emitting diode having a wafer with multiple epitaxial layers on a substrate; the method comprising applying a first ohmic contact layer on a front surface of the multiple epitaxial layers, the first ohmic contact layer being of a reflective material to also act as a reflective layer.

22 Claims, 5 Drawing Sheets

U.S. PATENT DOCUMENTS

| | | |
|---|---|---|
| 6,169,297 B1 | 1/2001 | Jang et al. |
| 6,210,479 B1 | 4/2001 | Bojarczuk et al. |
| 6,259,156 B1 | 7/2001 | Kohno |
| 6,303,405 B1 | 10/2001 | Yoshida et al. |
| 6,307,218 B1 | 10/2001 | Steigerwald et al. |
| 6,319,778 B1 | 11/2001 | Chen et al. |
| 6,365,429 B1 | 4/2002 | Kneissl et al. |
| 6,380,564 B1 | 4/2002 | Chen et al. |
| 6,420,242 B1 | 7/2002 | Cheung et al. |
| 6,420,732 B1 | 7/2002 | Kung et al. |
| 6,426,512 B1 | 7/2002 | Ito et al. |
| 6,448,102 B1 | 9/2002 | Kneissl et al. |
| 6,455,870 B1 * | 9/2002 | Wang et al. ............. 257/12 |
| 6,492,661 B1 | 12/2002 | Chien et al. |
| 6,509,270 B1 | 1/2003 | Held |
| 6,562,648 B1 | 5/2003 | Wong et al. |
| 6,573,537 B1 | 6/2003 | Steigerwald et al. |
| 6,586,875 B1 * | 7/2003 | Chen et al. ............. 313/506 |
| 6,589,857 B2 | 7/2003 | Ueda et al. |
| 6,627,921 B2 | 9/2003 | Wong et al. |
| 6,627,989 B2 | 9/2003 | Kohno et al. |
| 6,649,437 B1 | 11/2003 | Yang et al. |
| 6,677,173 B2 | 1/2004 | Ota |
| 6,821,804 B2 | 11/2004 | Mack et al. |
| 7,166,861 B2 | 1/2007 | Saito et al. |
| 7,338,822 B2 | 3/2008 | Wu et al. |
| 7,348,212 B2 | 3/2008 | Schiaffino et al. |
| 7,547,578 B2 | 6/2009 | Agarwal et al. |
| 7,763,477 B2 | 7/2010 | Yuan et al. |
| 8,004,001 B2 | 8/2011 | Yuan et al. |
| 8,034,643 B2 | 10/2011 | Kang et al. |
| 8,067,269 B2 | 11/2011 | Yuan et al. |
| 8,124,994 B2 | 2/2012 | Yuan et al. |
| 2001/0055324 A1 | 12/2001 | Ota |
| 2002/0022286 A1 | 2/2002 | Nikolaev et al. |
| 2002/0034835 A1 | 3/2002 | Chen et al. |
| 2002/0093023 A1 | 7/2002 | Camras et al. |
| 2002/0113279 A1 | 8/2002 | Hanamaki et al. |
| 2002/0117681 A1 | 8/2002 | Weeks et al. |
| 2002/0134985 A1 | 9/2002 | Chen et al. |
| 2002/0137243 A1 | 9/2002 | Chen et al. |
| 2002/0179910 A1 | 12/2002 | Slater, Jr. |
| 2003/0038284 A1 | 2/2003 | Kurahashi et al. |
| 2003/0064535 A1 | 4/2003 | Kub et al. |
| 2003/0111667 A1 | 6/2003 | Schubert |
| 2003/0151357 A1 | 8/2003 | Uemura |
| 2003/0178626 A1 | 9/2003 | Sugiyama et al. |
| 2003/0189212 A1 * | 10/2003 | Yoo ............. 257/79 |
| 2003/0189215 A1 * | 10/2003 | Lee et al. ............. 257/94 |
| 2003/0218179 A1 | 11/2003 | Koide et al. |
| 2004/0026709 A1 | 2/2004 | Bader et al. |
| 2004/0031967 A1 | 2/2004 | Fudeta et al. |
| 2004/0033638 A1 * | 2/2004 | Bader et al. ............. 438/46 |
| 2004/0065889 A1 | 4/2004 | Ueda et al. |
| 2004/0104395 A1 | 6/2004 | Hagimoto et al. |
| 2004/0110395 A1 | 6/2004 | Ueda et al. |
| 2004/0130037 A1 | 7/2004 | Mishra et al. |
| 2004/0144991 A1 | 7/2004 | Kikkawa |
| 2004/0217362 A1 | 11/2004 | Slater, Jr. et al. |
| 2004/0235210 A1 | 11/2004 | Tamura et al. |
| 2005/0014303 A1 | 1/2005 | Tsai et al. |
| 2005/0026399 A1 | 2/2005 | Chien et al. |
| 2005/0035354 A1 | 2/2005 | Lin et al. |
| 2005/0082555 A1 | 4/2005 | Chien et al. |
| 2005/0087884 A1 | 4/2005 | Stokes et al. |
| 2005/0093002 A1 | 5/2005 | Tsai et al. |
| 2005/0098792 A1 | 5/2005 | Lee et al. |
| 2005/0127397 A1 | 6/2005 | Borges et al. |
| 2005/0142875 A1 | 6/2005 | Yoo |
| 2005/0164482 A1 | 7/2005 | Saxler |
| 2005/0173692 A1 | 8/2005 | Park et al. |
| 2005/0208435 A1 * | 9/2005 | Chen et al. ............. 430/324 |
| 2006/0002442 A1 * | 1/2006 | Haberern et al. ............. 372/46.01 |
| 2006/0006554 A1 | 1/2006 | Yoo et al. |
| 2006/0099730 A1 | 5/2006 | Lee et al. |
| 2006/0124939 A1 | 6/2006 | Lee et al. |
| 2006/0151801 A1 | 7/2006 | Doan et al. |
| 2006/0154389 A1 * | 7/2006 | Doan ............. 438/21 |
| 2006/0154390 A1 | 7/2006 | Tran et al. |
| 2006/0154391 A1 | 7/2006 | Tran et al. |
| 2006/0154392 A1 | 7/2006 | Tran et al. |
| 2006/0154393 A1 | 7/2006 | Doan et al. |
| 2006/0157721 A1 | 7/2006 | Tran et al. |
| 2006/0163586 A1 | 7/2006 | Denbaars et al. |
| 2006/0186418 A1 | 8/2006 | Edmond et al. |
| 2007/0029541 A1 | 2/2007 | Xin et al. |
| 2008/0105303 A1 | 5/2008 | Oswald et al. |
| 2008/0164480 A1 | 7/2008 | Kang et al. |
| 2008/0210970 A1 | 9/2008 | Kang et al. |
| 2008/0265366 A1 | 10/2008 | Guo et al. |
| 2010/0047996 A1 | 2/2010 | Yuan et al. |
| 2010/0295014 A1 | 11/2010 | Kang et al. |

FOREIGN PATENT DOCUMENTS

| | | |
|---|---|---|
| EP | 1 061 590 A1 | 12/2000 |
| EP | 1 139 409 A2 | 10/2001 |
| EP | 1 326 290 A2 | 7/2003 |
| EP | 1 502 284 A2 | 2/2005 |
| EP | 1693891 A2 | 8/2006 |
| JP | 50-074876 | 6/1975 |
| JP | 52-055480 | 5/1977 |
| JP | 59-112667 | 6/1984 |
| JP | 63-095661 | 4/1988 |
| JP | 04-078186 | 3/1992 |
| JP | 05-291621 | 11/1993 |
| JP | 7326628 A | 12/1995 |
| JP | 10-117016 | 5/1998 |
| JP | 2000-164928 | 6/2000 |
| JP | 2000-183400 | 6/2000 |
| JP | 2000-277105 | 10/2000 |
| JP | 2000-294837 | 10/2000 |
| JP | 2001-035974 A | 2/2001 |
| JP | 2001-036129 | 2/2001 |
| JP | 2001-049491 | 2/2001 |
| JP | 2001-168094 A | 6/2001 |
| JP | 2001-168387 | 6/2001 |
| JP | 2001-237461 | 8/2001 |
| JP | 2001-274507 | 10/2001 |
| JP | 2001-313422 | 11/2001 |
| JP | 2003-152138 A | 5/2003 |
| JP | 2003-218383 | 7/2003 |
| JP | 2003-303743 | 10/2003 |
| JP | 2003-309286 | 10/2003 |
| JP | 2003-318443 | 11/2003 |
| JP | 2003-347590 | 12/2003 |
| JP | 2004-072052 | 3/2004 |
| JP | 2004-088083 | 3/2004 |
| JP | 2004-319552 A | 11/2004 |
| JP | 2005-012188 | 1/2005 |
| JP | 2005-236048 | 9/2005 |
| JP | 2005-260255 A | 9/2005 |
| JP | 2005-286187 A | 10/2005 |
| JP | 2006-253647 | 9/2006 |
| KR | 20010088931 | 9/2001 |
| KR | 10-0338180 | 5/2002 |
| KR | 10-2002-079659 | 10/2002 |
| KR | 20040058479 | 7/2004 |
| KR | 20040104232 | 12/2004 |
| SG | 200401424-7 | 3/2004 |
| SG | 200506301-1 | 9/2005 |
| SG | 200506897-8 | 10/2005 |
| SG | 200508210-2 | 12/2005 |
| SG | 200605500-8 | 8/2006 |
| SG | 200606050-3 | 9/2006 |
| TW | 419836 B | 1/2001 |
| TW | 475276 B | 2/2002 |
| TW | 540171 | 7/2003 |
| WO | WO 01/47039 A1 | 6/2001 |
| WO | WO 03/088320 A2 | 10/2003 |
| WO | WO 2004/102686 A1 | 11/2004 |
| WO | WO 2005/029572 A1 | 3/2005 |
| WO | WO 2005/029573 A1 | 3/2005 |
| WO | WO 2005/062745 A2 | 7/2005 |
| WO | WO 2005/064666 A1 | 7/2005 |
| WO | WO 2005/088743 A1 | 9/2005 |
| WO | WO 2005/096365 A1 | 10/2005 |
| WO | WO 2005/104780 A2 | 11/2005 |

| | | |
|---|---|---|
| WO | WO 2007/046773 A1 | 4/2007 |
| WO | WO 2007/037762 A1 | 5/2007 |
| WO | WO 2007/073354 A1 | 6/2007 |
| WO | WO 2008/020819 A1 | 2/2008 |
| WO | WO 2008/030188 A1 | 3/2008 |

OTHER PUBLICATIONS

Zhifang Fan, et al., "Very Low Resistance Multilayer Ohmic Contact to n-GaN," Applied Physics Letters, vol. 68, Issue 12, pp. 1672-1674, (Mar. 18, 1996).

I. Schnitzer, et al., "30% External Quantum Efficiency from Surface Textured, Thin-Film Light-Emitting Diodes," Applied Physics Letters, vol. 63, Issue 16, pp. 2174-2176, (Oct. 18, 1993).

Shyi-Ming Pan, et al., "Improvement of InGaN-GaN Light-Emitting Diodies with Surface-Textured Indium-Tin-Oxide Transparent Ohmic Contacts," IEEE Photonics Technology Letters, vol. 15, Issue 5, pp. 649-651, (May 2003).

Chul Huh, et al., "Improved Light-Output and Electrical Performance of InGaN-Based Light-Emitting Diode by Microroughening of the p-GaN Surface," Journal of Applied Physics, vol. 93, Issue 11, pp. 9383-9385, (Jun. 1, 2003).

F.A. Kish, et al., "Very High-Efficiency Semiconductor Wafer-Bonded Transparent-Substrate ($Al_xGa_{1-x}$)$_{0.5}In_{0.5}$P/GaP Light-Emitting Diodes," Applied Physics Letters, vol. 64, Issue 21, pp. 2839-2841, (May 23, 1994).

R.H. Horng, et al., "AlGaInP Light-Emitting Diodes with Mirror Substrates Fabricated by Wafer Bonding," Applied Physics Letters, vol. 75, Issue 20, pp. 3054-3056, (Nov. 15, 1999).

H. Sugawara, et al., "Characteristics of a Distributed Bragg Reflector for the Visible-Light Spectral Region using InGaAlP and GaAs: Comparison of Transparent- and Loss-Type Structures," Journal of Applied Physics, vol. 74, Issue 5, pp. 3189-3193, (Sep. 1, 1993).

PCT International Search Report for PCT Application No. PCT/SG2003/000222 containing Communication relating to the Results of the Partial International Search Report, 3 pgs., (Dec. 9, 2003).

PCT International Search Report for PCT Application No. PCT/SG2003/000223 containing Communication relating to the Results of the Partial International Search Report, 3 pgs., (Dec. 9, 2003).

PCT International Search Report for PCT Application No. PCT/SG2005/000061 containing Communication relating to the Results of the Partial International Search Report, 2 pgs., (May 12, 2005).

PCT International Search Report for PCT Counterpart Application No. PCT/SG2005/000062 containing Communication relating to the Results of the Partial International Search Report, 2 pgs., (May 12, 2005).

PCT International Search Report for PCT Application No. PCT/SG2006/000254 containing Communication relating to the Results of the Partial International Search Report, 4 pgs., (Nov. 16, 2006).

PCT International Search Report for PCT Application No. PCT/SG2006/000255 containing Communication relating to the Results of the Partial International Search Report, 3 pgs., (Nov. 6, 2006).

PCT International Search Report for PCT Application No. PCT/SG2006/000395 containing Communication relating to the Results of the Partial International Search Report, 3 pgs., (Feb. 26, 2007).

PCT International Search Report for PCT Application No. PCT/SG2007/000261 containing Communication relating to the Results of the Partial International Search Report, 3 pgs., (Oct. 12, 2007).

PCT International Search Report for PCT Application No. PCT/SG2007/000288 containing Communication relating to the Results of the Partial International Search Report, 3 pgs., (Nov. 9, 2007).

Ueda, Tetsuzo et al., "Vertical InGaN-based blue light emitting diode with plated metal base fabricated using laser lift-off technique," Phys. Stat. Sol.(c) 0, No. 7, Oct. 20, 2003, pp. 2219-2222, Wiley-VCH Verlag GmbH & Co., KGaA, Weinhem, 2003.

Chu, Chen F., et al., "Comparison of p-Side Down and p-Side Up GaN Light-Emitting Diodes Fabricated by Laser Lift-Off", Japan Journal of Applied Physics, vol. 42, (Feb. 15, 2003). 147-150.

Li, W H., et al., "Electrochemical deposition of Copper on patterned Cu/Ta(N)SiO2 surfaces for super filling of sub-micron features", Journal of Applied Electrochemistry, vol. 31, (2001), 1395-1397.

PCT International Preliminary Report on Patentability for PCT Counterpart Application No. PCT/SG2005/000062, 6 pgs., (Mar. 1, 2006).

PCT Written Opinion of the International Searching Authority for PCT Counterpart Application No. PCT/SG2005/000062, 4 pgs., (May 12, 2005).

Supplemental European Search Report for EP05711220, dated Nov. 11, 2010, 2 pages.

Supplementary European Search Report for European Application No. 03818739, 1 page, (Jan. 19, 2011).

Supplementary European Search Report for EP06784267, 3 pages (Jan. 27, 2011).

Written Opinion for Chinese Patent Application No. 3827175.3, 6 pgs., (May 23, 2011).

* cited by examiner

FABRICATION OF REFLECTIVE LAYER ON SEMICONDUCTOR LIGHT EMITTING DEVICES

FIELD OF THE INVENTION

The present invention relates to the fabrication of a reflective layer on semiconductor light emitting diodes and particularly, though not exclusively, to such a method and light emitting diode where the reflective layer acts also as the ohmic contact to the front surface of the light emitting diode.

BACKGROUND TO THE INVENTION

Light emitting diodes have been recently used in large volume in mobile handsets, digital cameras, personal digital assistants, traffic lights, automobiles, and so forth. Higher brightness is required before light emitting diodes can be used for other applications such as, for example, general illumination, as the brightness of the emitted light is not sufficient for light emitting diodes to be used in such applications.

There are a few reasons why the brightness and output power of light emitting diodes is limited. One of the major reasons is the limited light extraction efficiency. Due to total reflection at the interface between light emitting diode surfaces (semiconductor), or plastic encapsulation of a light emitting diode, the external efficiency of most light emitting diodes is limited to a few percent of input electrical power, while the internal efficiency is often as high as over 90%. The internal quantum efficiency characterises how many photons are generated for each electron passing through the light emitting diode. The extraction efficiency is the percentage of the generated light that escapes from the semiconductor light emitting diode.

Various methodologies have been developed to improve the light extraction efficiency, including:
(a) surface texturing (I. Schnitzer and E. Yablonovitch, C. Caneau, T. J. Gmitter, and A Schere, Applied Physics Letters, Volume 63, page 2174, October 1993);
(b) replacing the absorbing substrate with a non-absorbing substrate (F. A Kish, F. M. Steranka, D. C. DeFevere, D. A. Vanderwater, K. G. Park, C. P. Kuo, T. D. Osentowski, M. J. Peanasky, J. G. Yu, R. M. Fletcher, D. A. Steigerwald, M. G. Craford, and V. M. Robbins, Applied Physics Letters, volume 64, page 2839, 1994);
(c) providing a mirror on or within the substrate (R. H. Homg, D. S. Wuu, S. C. Wei, C. Y. Tseng, M. F. Huang, K. H. Chang, P. H. Liu, K. C. Lin, Applied Physics Letters, Volume 75, page 3054, November 1999) by wafer bonding or eutectic bonding;
(d) changing the chip geometry; and
(e) growing a semiconductor distributed Bragg reflector mirror (H. Sugawara, H. Itaya, G. Hatakoshi, Journal of Applied Physics, Volume 74, page 3189, 1993);
and so forth.

The reflective layer is normally on the rear surface—the surface to which the substrate is attached. This is because the ohmic contacts to the semiconductor are normally made on the front surface (especially for GaN light emitting diodes on a sapphire substrate), and light is emitted from the front surface and the edges of the substrate. To make this reflective layer requires a number of process steps. This is inefficient. Often the reflective layer reacts with the semiconductor layer and the solder materials, and adhesion of the reflective mirror layer to the underlying semiconductor is also a problem.

For GaN-based and AlGaInP light emitting diodes, the substrates are not good thermal conductive materials, and it is desirable to remove the substrate. In addition, the removal of the substrate simplifies the device fabrication with reflection mirrors, since the reflection mirror is on the front surface of the semiconductor, not on the back surface of the substrate, and acts also as the ohmic contact to the semiconductor front surface.

GaN blue laser performance is also improved by the removal of the substrate (W. S. Wong, M. A, Kneissl, U.S. Pat. No. 6,627,921 B2). Bonding the semiconductor epitaxial layers, either before or after the removal of the substrate from the semiconductor expitaxial layers, to a mechanical support (new substrate) by using eutectic bonding, wafer bonding, or by using organic bonding material, complicates the process and may limit the yield and throughput of the production. Often the bonding must be done at elevated temperatures. This may cause additional problems. For GaN light emitting diodes it is difficult to remove the sapphire substrate for the whole wafer and keep the epitaxial layer intact, making it difficult for large volume manufacturing by using bonding methods. This is because the bonding methods do not provide intimate and homogeneous bonding between the epitaxial layers and the new mechanical substrate, and the warping of the epitaxial layers on the new substrate causes cracks or stress in the epitaxial layers.

SUMMARY OF THE INVENTION

In accordance with a preferred form there is provided a method for fabrication of a reflective layer on a semiconductor light emitting diode, the semiconductor light emitting diode being made from a wafer with multiple epitaxial layers on a substrate; the method comprising applying a first ohmic contact layer on a front surface of the multiple epitaxial layers, the first ohmic contact layer being of a reflective material to also act as a reflective layer at its interface with the front surface.

The method may also include:
(a) applying to a front surface of the first ohmic contact layer a seed layer of a thermally conductive metal;
(b) electroplating a relatively thick layer of the thermally conductive metal on the seed layer; and
(c) removing the substrate.

The first ohmic contact layer may be coated with an adhesion layer prior to application of the seed layer.

The seed layer may be patterned with photoresist patterns before the electroplating step, the electroplating of the relatively thick layer being between the photoresist patterns. Between steps (b) and (c) there may be performed the additional step of annealing the wafer to improve adhesion. The photoresist patterns may be of a height of at least 50 micrometers, a thickness in the range 3 to 500 micrometers, and a spacing of 300 micrometers.

The seed layer may be electroplated without patterning, patterning being performed subsequently. Patterning may be by photoresist patterning and then wet etching; or by laser beam micro-machining of the relatively thick layer. The relatively thick layer may be of a height no greater that the photoresist height.

Alternatively, the relatively thick layer of thermally conductive metal may electroplated to a height greater than the photoresist and is subsequently thinned. Thinning may be by polishing.

After step (c) there may be included an extra step of forming on a rear surface of the epitaxial layers a second ohmic contact layer, the second ohmic contact layer being selected from the group consisting of: opaque, transparent, and semitransparent. The second ohmic contact layer may be blank or patterned. Bonding pads may be formed on the second ohmic contact layer.

After step (c) ohmic contact formation and subsequent process steps may be carried out, the subsequent process steps including deposition of wire bond pads. The exposed rear surface of the epitaxial layer may be cleaned and etched before the second ohmic contact layer is deposited. The second ohmic contact layer may not cover the whole area of the second surface of the epitaxial layers.

After forming the second ohmic contact layer there is included testing of the light emitting devices on the wafer, and separating the wafer into individual devices. The light emitting devices may be fabricated without one or more selected from the group consisting of: lapping, polishing and dicing.

The first ohmic contact layer may be on o-type layers of the epitaxial layers, and the second ohmic contact layer may be formed on n-type layers of the expitaxial layers.

Dielectric films may be deposited on the epitaxial layers, openings cut in the dielectric films and second ohmic contact layer, and bond pads deposited on the epitaxial layers.

After step (c), electroplating of a thermally conductive metal on the epitaxial layers may be performed.

The thermally conductive metal may be copper, and the epitaxial layers may be multiple GaN-related layers.

In a further aspect, there is provided a light emitting device comprising epitaxial layers, a first ohmic contact layer on a front surface of the epitaxial layers, the first ohmic contact layer being of a reflective material and, at its interface with the epitaxial layers, acts as a mirror.

There may also be an adhesive layer on the first ohmic contact layer, a seed layer of a thermally conductive metal on the adhesive layer, and a relatively thick layer of the thermally conductive metal on the seed layer. The relatively thick layer may one or more of a heat sink, an electrical connector, and a mechanical support.

A second ohmic contact layer may be provided on a rear surface of the epitaxial layers; the second ohmic contact layer being a thin layer in the range of from 3 to 500 nanometers.

The second ohmic contact layer may also comprise bonding pads and may be selected from the opaque, transparent, and semitransparent.

There may be an adhesive layer on the first ohmic contact layer between the first ohmic contact layer and the relatively thick layer, and a seed layer of the thermally conductive metal between the adhesive layer and the relatively thick layer. The relatively thick layer may be at least 50 micrometers thick.

The light emitting device may be: a light emitting diode or a laser diode.

BRIEF DESCRIPTION OF THE DRAWINGS

In order that the invention may be better understood and readily put into practical effect there shall now be described by way of non-limitative example only a preferred embodiment of the present invention, the description being with reference to the accompanying illustrative (and not to scale) drawings in which.

DETAILED DESCRIPTION OF THE PREFERRED EMBODIMENT

Figure 8:
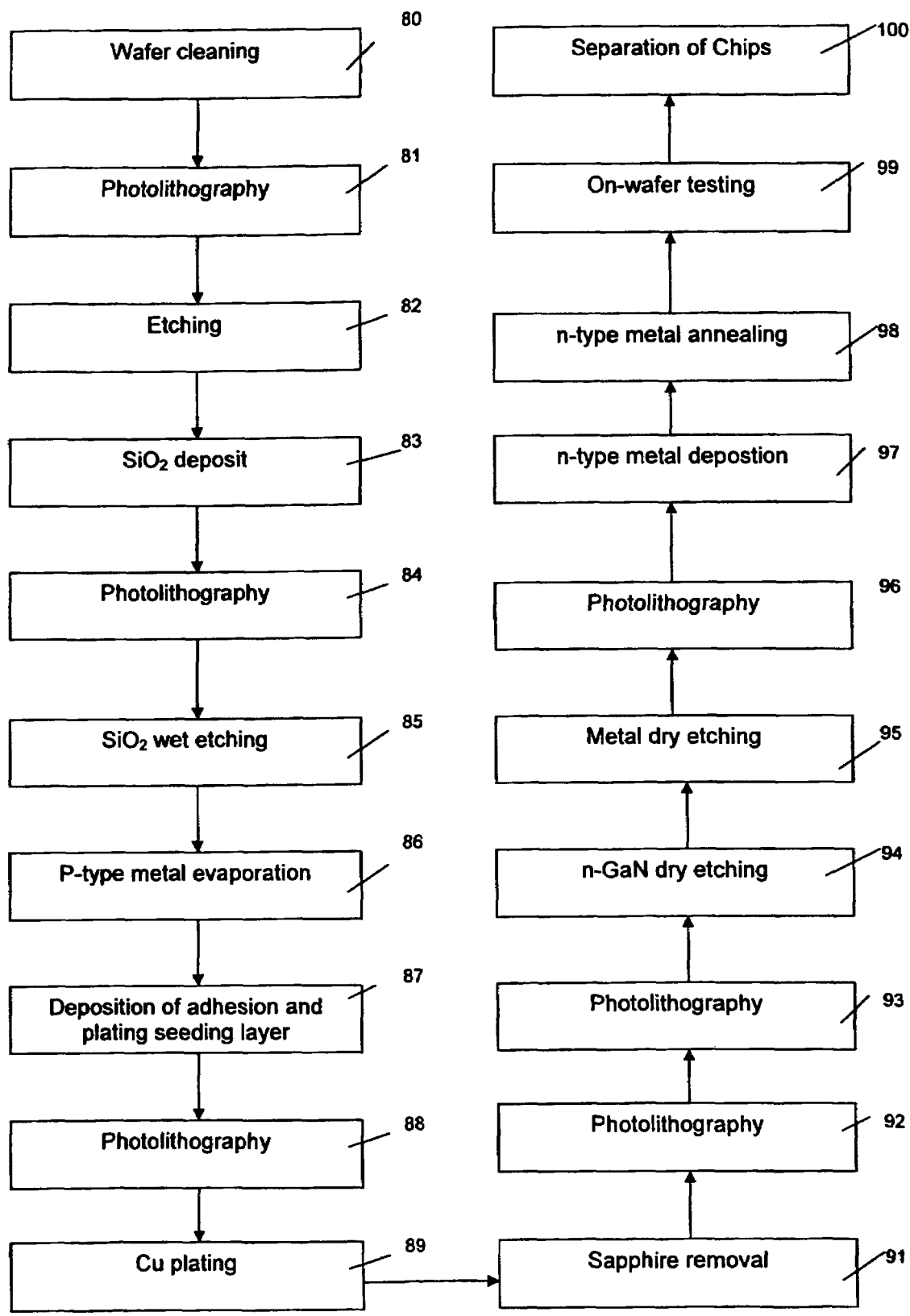
FIG. 8 is a flow chart of the process.

For the following description, the reference numbers in brackets refer to the process steps in FIG. 8.

Figure 1:
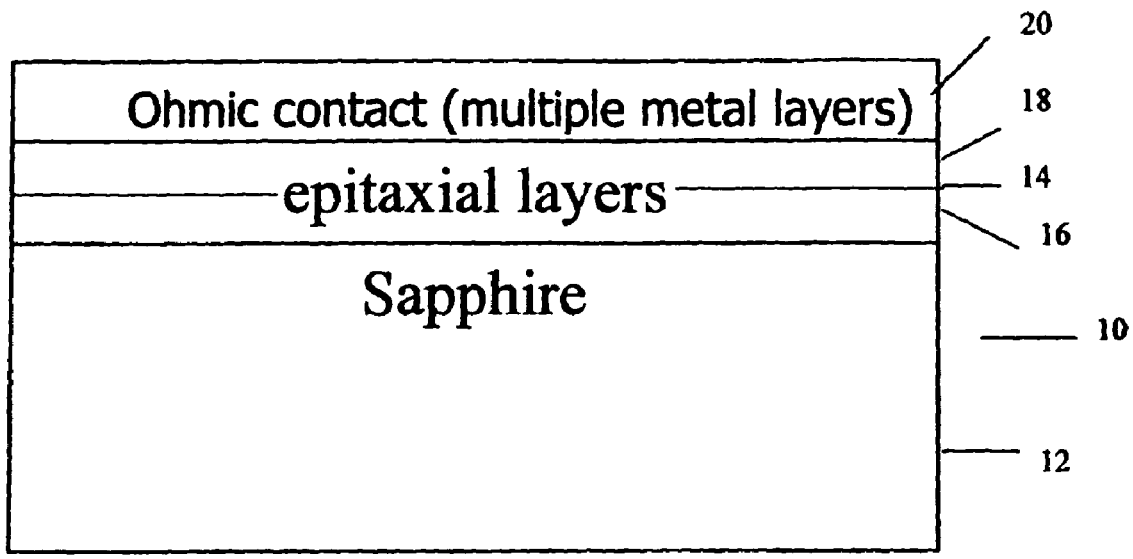
FIG. 1 is a schematic representation of a light emitting device at a first stage in the fabrication process.

To refer to FIG. 1, there is shown the first step in the process—the metallization on the p-type surface of the wafer 10.

The wafer 10 is an epitaxial wafer with a substrate and a stack of multiple epitaxial layers 14 on it. The substrate 12 can be, for example, sapphire, GaAs, InP, Si, and so forth. Henceforth a GaN sample having GaN layer(s) 14 on sapphire substrate 12 will be used as an example. The epitaxial layers 14 (often called epilayers) are a stack of multiple layers, and the lower part 16 (which is grown first on the substrate) is usually n-type layers and the upper part 18 is often p-type layers.

Figure 2:
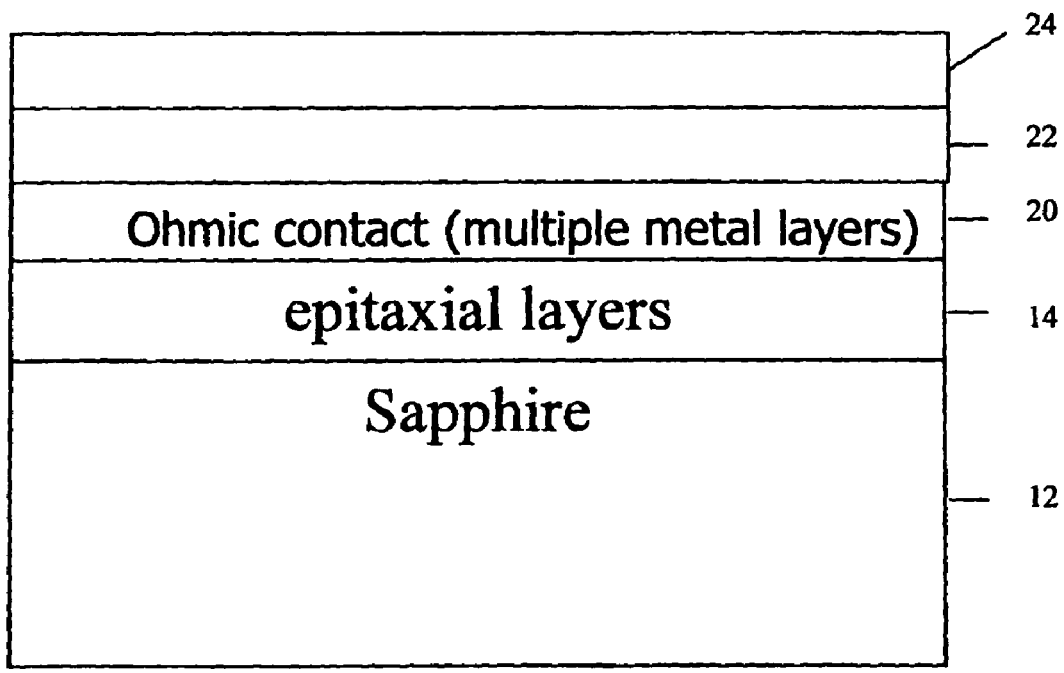
FIG. 2 is a schematic representation of the light emitting device of FIG. 1 at a second stage in the fabrication process.

On the front or top surface of GaN layers 14 is a first ohmic contact layer 20 of a reflective material and having multiple metal layers. As the front surface is relatively smooth and as first ohmic contact layer has metal layers, it is reflective. Therefore, additional process steps are not required to fabricate the reflective layer. To ohmic contact layer 20 is added an adhesion layer 22, and a thin copper seed layer 24 (FIG. 2) (step 88) of a thermally conductive metal such as, for example, copper. The thermally conductive metal is preferably also electrically conductive. The stack of adhesion layers may be annealed after formation.

The first ohmic layer 20 may be a stack of multiple layers deposited and annealed on the epitaxial surface. It may not be part of the original wafer. For GaN, GaA, and InP devices, the epitaxial wafer often contains an active region that is sandwiched between n-type and p-type semiconductors. In most cases the top layer is p-type.

Figure 3:
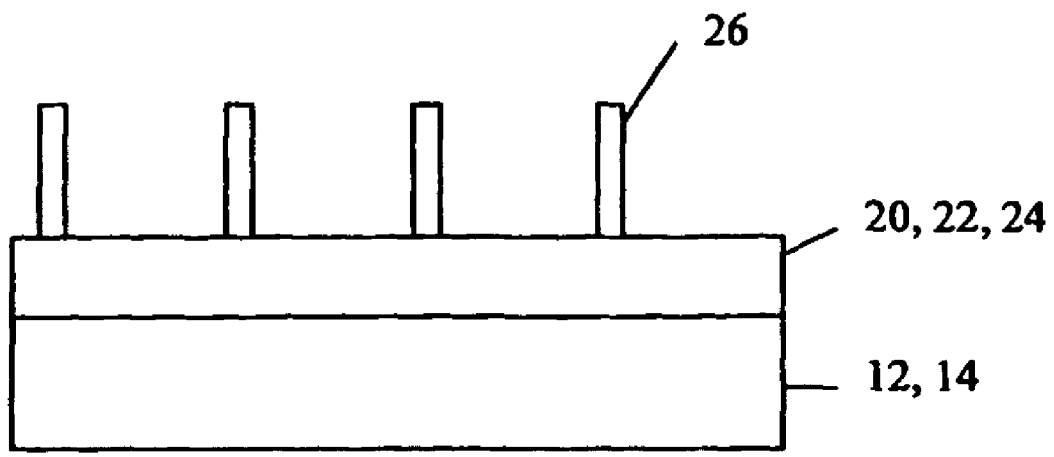
FIG. 3 is a schematic representation of the light emitting device of FIG. 1 at a third stage in the fabrication process.

As shown in FIG. 3, using standard photolithography (89), the thin copper seed layer 24 is patterned with relatively thick photoresists 26. The photoresist patterns 26 are of a height of at least 50 micrometers, preferably in the range 50 to 300 micrometers, more preferably 200 micrometers; and with a thickness of about 3 to 500 micrometers. They are preferably separated from each other by a spacing of about 300 micrometers, depending on the design of the final chips. The actual pattern depends on device design.

A patterned layer 28 of copper is then electroplated onto layer 24 (90) between photoresists 26 to form a heat sink that forms a part of the substrate. The copper layer 28 is preferably of a height no greater than that of the photoresists 26. However, the copper layer 28 may be of a height greater than that of the photoresists 26. In such a case, the copper layer 28 may be subsequently thinned to be of a height no greater than that of the photoresists 26. Thinning may be by polishing or wet etching. The photoresists 26 may or may not be removed after the copper plating. Removal may be by a standard and known method such as, for example, resin in the resist stripper solution, or by plasma etching.

Figure 4:
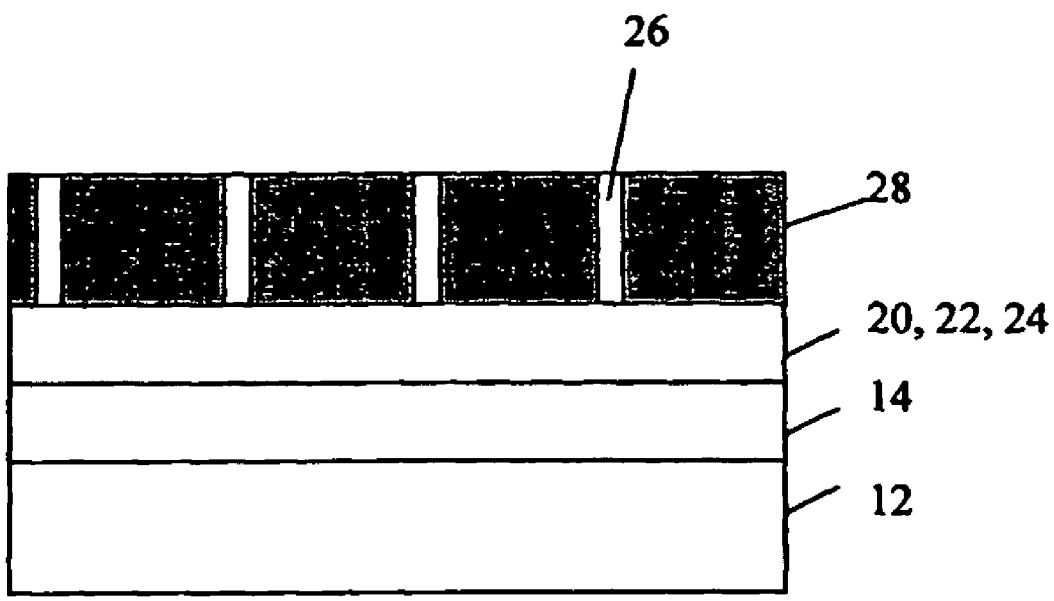
FIG. 4 is a schematic representation of the light emitting device of FIG. 1 at a fourth stage in the fabrication process.

Depending on the device design, processing of the epitaxial layers 14 follows using standard processing techniques such as, for example, cleaning (80), lithography (81), etching (82), device isolation (83), passivation (84), metallization (85), thermal processing (86), and so forth. (FIG. 4). The wafer 10 is then annealed (87) to improve adhesion.

The epitaxial layer 14 is usually made of n-type layers 16 on the original substrate 12; and p-type layers on the original front or top surface 18 which is now covered with the ohmic layer 20, adhesion layer 22, copper seed layer 24, and the electroplated thick copper layer 28.

Figure 5:
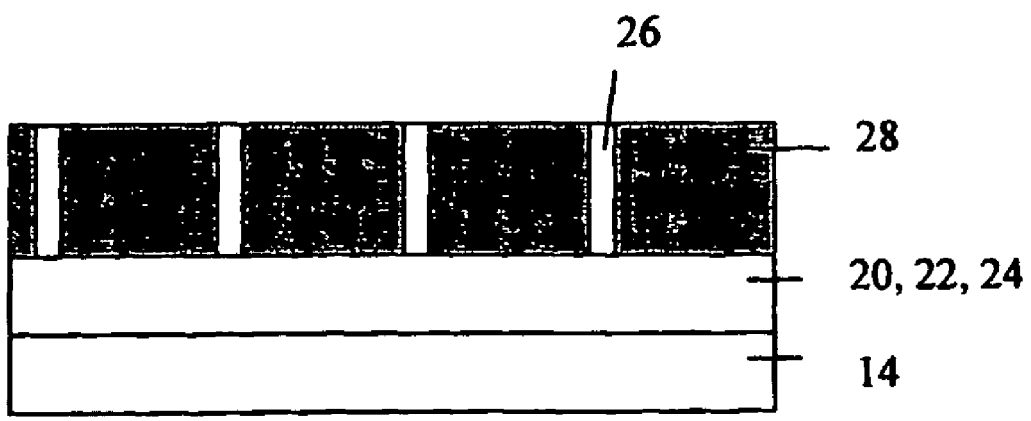
FIG. 5 is a schematic representation of the light emitting device of FIG. 1 at a fifth stage in the fabrication process.

In FIG. 5, the original substrate layer 12 is then removed (91) using, for example, the method of Kelly [M. K. Kelly, O. Ambacher, R. Dimitrov, R. Handschuh, and M. Stutzmann, phys. stat. sol. (a) 159, R3 (1997)]. The substrate may also be removed by polishing or wet etching.

Figure 6:
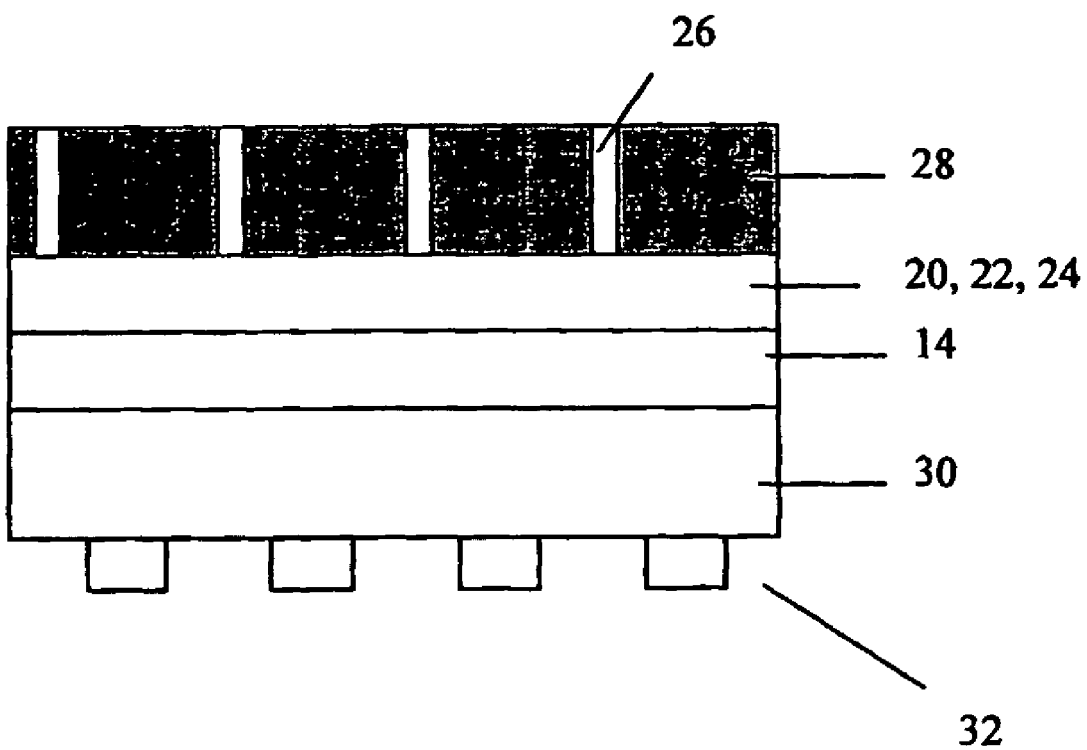
FIG. 6 is a schematic representation of the light emitting device of FIG. 1 at a sixth stage in the fabrication process.

FIG. 6 is the penultimate step and is particularly relevant for light emitting diodes where a second ohmic contact layer 30 is added on the rear surface of, (or beneath), epitaxial layers 14, for light emission. Bonding pads 32 are also added. The second ohmic contact layer 30 is preferably transparent or semi-transparent It is more preferably a thin layer and may be in the range of 3 to 50 nm thick.

Prior to adding second ohmic contact layer 30, known preliminary processes may be performed. These may be, for example, photolithography (92, 93), dry etching (94, 95), and photolithography (96).

Annealing (98) may follow the deposition of second ohmic contact layer 30.

Figure 7:
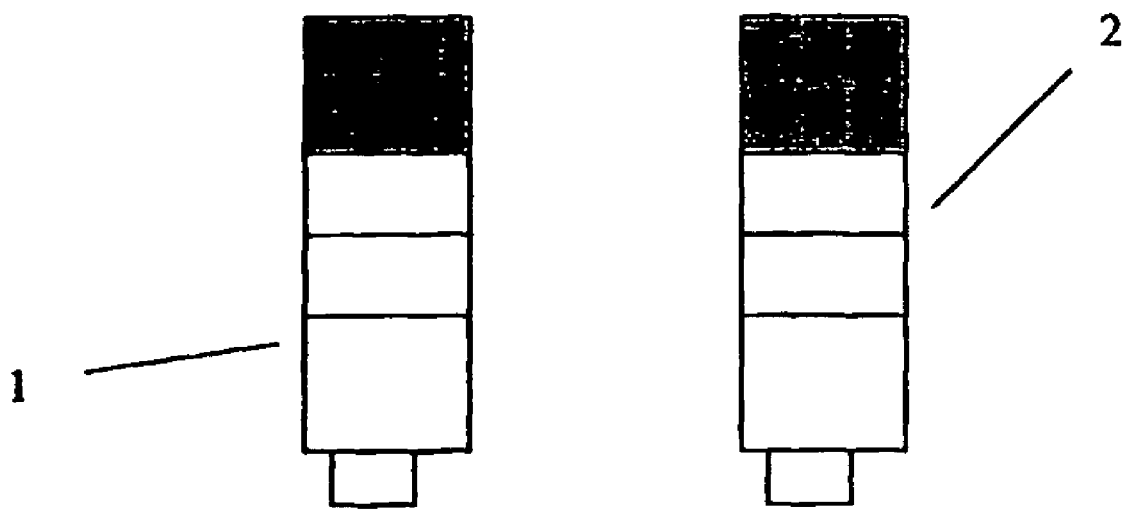
FIG. 7 is a schematic representation of the light emitting device of FIG. 1 at the seventh stage in the fabrication process.

The chips/dies are then tested (99) by known and standard methods. The chips/dies can then be separated (100) (FIG. 7) into individual devices/chips 1 and 2 without lapping/polishing the substrate, and without dicing. Packaging follows by standard and known methods.

The top surface of the epitaxial layer 14 is preferably in the range of about 0.1 to 2.0 microns, preferably about 0.3 microns, from the active region. As the active region of the light emitting diode chip in this configuration is close to a relatively thick copper pad 28, the rate of heat removal is improved over the sapphire configuration.

Additionally or alternatively, the relatively thick layer 28 may be used to provide mechanical support for the chip. It may also be used to provide a path for heat removal from the active region of the light emitting device chip, and may also be used for electrical connection.

The plating step is performed at the wafer level (i.e., before the dicing operation) and may be for several wafers at the one time.

The first ohmic contact layer 20, being metal and relatively smooth, is quite shiny and therefore highly reflective of light. As such the first ohmic contact layer 20, at its interface with the front surface of epitaxial layers 14, also acts as a reflective surface, or mirror, to improve light output. This is achieved without additional fabrication steps. The ohmic contact layer/reflective layer 20 may be of a pure metal or a stack of multiple metal layers, for example, Ni/Au, Ru/Au, Indium Tin Oxide (ITO), Ta/Ti, and so forth.

Although the preferred embodiments refer to the use of copper, any other platable material may be used provided it is electrically and/or heat conductive, or provides the mechanical support for the light emitting device.

By combining the reflection mirror layer formation and ohmic contact formation in a single step, the problem of bonding to another substrate is avoided. Electroplating of copper or other thermally and electrically conductive materials (e.g. metals) on the reflective mirror/ohmic contact layer is preferably at room temperature. This avoids the elevated temperatures used in present bonding processes. The relatively thick electroplated layer may be, for example, 250 micron thick. As such, it may serve as a mechanical support, thermal conductor, and an electrical conductor, thus making the removal of the original substrate somewhat easier.

Preferably, each light emitting diode die is isolated from other dies before the removal of the substrate, thus any warping or bending of the whole wafer during or after the removal of the substrate does not cause stress or cracks in individual light emitting diode dies. Since the relatively thick layer is electrically conductive, current can flow from on side of the die to the other. As a result, only one bonding wire is required. Most GaN-based light emitting diodes are on the market require two-wire bonding, as the sapphire is an insulator.

Whilst there has been described in the foregoing description a preferred form of the present invention, it will be understood by those skilled in the technology that many variations or modifications in design, construction or operation may be made without departing from the present invention.

The invention claimed is:

1. A method for fabrication of a reflective layer on a semiconductor light emitting diode, the semiconductor light emitting diode being made from a wafer with multiple epitaxial layers on a substrate, the method comprising:
    applying a first ohmic contact layer on a front surface of the multiple epitaxial layers, the first ohmic contact layer being of a reflective material to also act as a reflective layer at its interface with the front surface;
    applying a second ohmic contact layer on a rear surface of the multiple epitaxial layers, wherein the second ohmic contact layer is transparent or semi-transparent;
    applying to a front surface of the first ohmic contact layer a seed layer of a thermally conductive metal; and
    electroplating a relatively thick layer of the thermally conductive metal on the seed layer, the relatively thick layer of the thermally conductive metal being electrically conductive such that only a single bonding wire is required for the semiconductor light emitting diode.

2. A method as claimed in claim 1, further comprising: removing the substrate.

3. A method as claimed in claim 2, wherein after electroplating a relatively thick layer and before removing the substrate there is performed the additional step of annealing the wafer to improve adhesion.

4. A method as claimed in claim 2, wherein the second ohmic contact layer is applied after removing the substrate; the second ohmic contact layer being one of blank and patterned.

5. A method as claimed in claim 4, wherein at least one bonding pad is formed on the second ohmic contact layer.

6. A method as claimed in claim 4, wherein the second ohmic contact layer does not cover the whole area of the second surface of the epitaxial layers.

7. A method as claimed in claim 4, wherein the second ohmic contact layer is formed on n-type layers of the epitaxial layers.

8. A method as claimed in claim 2, wherein after removing the substrate ohmic contact formation and subsequent process steps are carried out, the subsequent process steps including deposition of at least bonding pad.

9. A method as claimed in claim 8, wherein the exposed epitaxial layer is cleaned and etched before the second ohmic contact layer is deposited.

10. A method as claimed in claim 8, wherein after forming the second ohmic contact layer there is included testing of the light emitting devices on the wafer, and separating the wafer into individual devices.

11. A method as claimed in claim 2, wherein the thermally conductive metal comprises copper and the epitaxial layers comprise multiple GaN-related layers.

12. A method as claimed in claim 1, wherein the first ohmic contact layer is coated with an adhesion layer prior to application of the seed layer.

13. A method as claimed in claim 1, wherein the seed layer is patterned with photoresist patterns before the electroplating the relatively thick layer, the electroplating of the relatively thick layer being between the photoresist patterns.

14. A method as claimed in claim 13, wherein the photoresist patterns are of a height of at least 50 micrometers.

15. A method as claimed in claim 13, wherein the photoresist patterns have a thickness in the range of 3 to 500 micrometers.

16. A method as claimed in claim 13, wherein the photoresist patterns have a spacing of 300 micrometers.

17. A method as claimed in claim 1, wherein the electroplating a relatively thick layer of the thermally conductive metal on the seed layer comprises electroplating the seed layer without patterning, patterning being performed subsequently.

18. A method as claimed in claim 17, wherein patterning is by one of: photoresist patterning and then wet etching, and laser beam micro-machining of the relatively thick layer.

19. A method as claimed in claim 1, wherein the relatively thick layer is of a height no greater than the photoresist height.

20. A method as claimed in claim 1, wherein the relatively thick layer of thermally conductive metal is electroplated to a height greater than the photoresist and is subsequently thinned by polishing.

21. A method as claimed in claim 1, wherein the light emitting devices are fabricated without one or more selected from the group consisting of: lapping, polishing and dicing.

22. A method as claimed in claim 1, wherein the first ohmic contact layer is on p-type layers of the epitaxial layers.

* * * * *